(12) United States Patent
Murata et al.

(10) Patent No.: US 10,114,070 B2
(45) Date of Patent: Oct. 30, 2018

(54) SUBSTRATE INSPECTION APPARATUS

(71) Applicant: Tokyo Electron Limited, Tokyo (JP)

(72) Inventors: Michio Murata, Nirasaki (JP); Shingo Morita, Nirasaki (JP); Kenichi Narikawa, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 142 days.

(21) Appl. No.: 14/487,480

(22) Filed: Sep. 16, 2014

(65) Prior Publication Data

US 2015/0077152 A1    Mar. 19, 2015

(30) Foreign Application Priority Data

Sep. 17, 2013  (JP) ................................. 2013-192193
Mar. 26, 2014  (JP) ................................. 2014-063513

(51) Int. Cl.
*G01R 31/28* (2006.01)
(52) U.S. Cl.
CPC ...... *G01R 31/2889* (2013.01); *G01R 31/2846* (2013.01); *G01R 31/2896* (2013.01)
(58) Field of Classification Search
CPC ........................ G01R 1/07342; G01R 31/2601
USPC .................................................... 324/756.03
See application file for complete search history.

(56) References Cited

U.S. PATENT DOCUMENTS

| | | | |
|---|---|---|---|
| 5,869,961 A | 2/1999 | Spinner | |
| 6,363,509 B1* | 3/2002 | Parulkar | G01R 31/318371 714/738 |
| 6,885,203 B1 | 4/2005 | Woodberry | |
| 6,975,130 B2* | 12/2005 | Yevmenenko | H05K 1/0266 324/750.01 |
| 7,906,982 B1* | 3/2011 | Meade | G01R 31/318511 324/754.01 |
| 2002/0125904 A1 | 9/2002 | Eldridge | |
| 2003/0141860 A1* | 7/2003 | Chi | G01R 31/2868 324/750.03 |
| 2006/0273809 A1* | 12/2006 | Miller | G01R 31/2889 324/750.05 |
| 2007/0063721 A1 | 3/2007 | Dozier | |
| 2009/0273358 A1* | 11/2009 | Arkin | G01R 1/07307 324/756.03 |

(Continued)

FOREIGN PATENT DOCUMENTS

| | | |
|---|---|---|
| JP | 07-297242 A | 11/1995 |
| KR | 10-2010-0009653 A | 1/2010 |

*Primary Examiner* — Melissa Koval
*Assistant Examiner* — Courtney Mcdonnough
(74) *Attorney, Agent, or Firm* — Pearne & Gordon LLP

(57) ABSTRACT

A substrate inspection apparatus can efficiently inspect electric characteristics of the semiconductor device. A prober 10 includes a probe card 15 having a multiple number of probe needles 17 to be brought into contact with electrodes of a semiconductor device formed on a wafer W; and a test box 14 electrically connected to the probe card 15. A card-side inspection circuit of the probe card 15 reproduces a circuit configuration on which the semiconductor device is to be mounted after separated from the wafer W, e.g., the circuit configuration of a function extension card, and a box-side inspection circuit 21 of the test box 14 reproduces a circuit configuration on which the semiconductor device is to be mounted, e.g., a part of the circuit configuration of the mother board.

3 Claims, 4 Drawing Sheets

(56) References Cited

U.S. PATENT DOCUMENTS

2010/0156434 A1* 6/2010 Okino ............... G01R 31/2886
324/537

* cited by examiner

SUBSTRATE INSPECTION APPARATUS

CROSS-REFERENCE TO RELATED APPLICATION

This application claims the benefit of Japanese Patent Application Nos. 2013-192193 and 2014-063513 filed on Sep. 17, 2013 and Mar. 26, 2014, respectively, the entire disclosures of which are incorporated herein by reference.

TECHNICAL FIELD

The embodiments described herein pertain generally to a substrate inspection apparatus which inspects a semiconductor device formed on a substrate without separating the semiconductor device from the substrate.

BACKGROUND

A prober is known as a substrate inspection apparatus which inspects electric characteristics of a semiconductor device, such as a power device or a memory, formed on a semiconductor wafer (hereinafter, simply referred to as "wafer") as a substrate.

The prober includes a probe card having a multiple number of probe needles, and a stage configured to be freely moved in upward, downward, leftward and rightward directions while holding a wafer thereon. The prober inspects electric characteristics of a semiconductor device by bringing the probe needles of the probe card into contact with electrode pads or solder bumps of the semiconductor device, so that inspection currents are flown to the electrode pads or the solder bumps from the probe needles (refer to, for example, Patent Document 1).

Conventionally, the prober includes an IC tester, which is a dedicated circuit for measuring the electric characteristics, e.g., a resistance of a semiconductor device. This IC tester has a circuit configuration different from a circuit configuration of a circuit board, such as a mother board or a function extension card, on which manufactured semiconductor devices are mounted. Accordingly, the IC tester cannot inspect the semiconductor device in an actually mounted state. As a result, there is a problem that an error of the semiconductor device, which has not been detected in the IC tester, might be found when the semiconductor device is actually mounted on the function extension card, etc. Recently, as processes implemented by the mother board or the function extension card become complicated and high-speed, the circuit configuration of the mother board or the function extension is also getting complicated, and a difference from the circuit configuration of the IC tester is increased. Thus, the above-mentioned problem is becoming more serious.

Accordingly, in order to ensure the quality of a semiconductor device, in addition to the testing by the IC tester, re-inspection of the semiconductor device, e.g., an operation test has been carried out after mounting the semiconductor device separated from the wafer on the mother board or the function extension card before shipping the mother board or the function extension card. The inspection in such a mounted state is called a system level test.

Patent Document 1: Japanese Laid-open Patent Publication No. H07-297242

However, if the error of the semiconductor device is found in the state where the semiconductor device is mounted on the mother board or the function extension card, it will result in waste of man-hour, materials, and so forth that have been consumed until then.

SUMMARY

In view of the foregoing problems, example embodiments provide a substrate inspection apparatus capable of inspecting electric characteristics of a semiconductor device without unnecessarily consuming manufacturing costs, materials, etc.

In one example embodiment, a substrate inspection apparatus includes a probe card having a multiple number of probes to be brought into contact with electrodes of a semiconductor device formed on a substrate; and a test box electrically connected to the probe card. Here, the probe card and the test box are configured to reproduce a circuit configuration on which the semiconductor device is to be mounted after separated from the substrate.

In the example embodiment, the probe card may be configured to reproduce a circuit configuration of a function extension card on which the semiconductor device is to be mounted, and the test box may be configured to reproduce a circuit configuration of a mother board to which the function extension card is connected.

In the example embodiment, the semiconductor device may be a MPU (Main Processing Unit), an APU (Accelerated Processing Unit), a GPU (Graphics Processing unit), or a RF tuner, and the function extension card may be a card on which one of the MPU, the APU, the GPU and the RF tuner is to be mounted.

In the example embodiment, the substrate inspection apparatus may further include a loader configured to load the substrate, and the loader may include a basic unit which reproduces a common part between various circuit configurations on which the semiconductor device is to be mounted.

In the example embodiment, the probe card and the test box may be electrically connected to each other via a flexible wiring.

In the example embodiment, the test box may include a board to which a board having a circuit configuration on which the semiconductor device is to be mounted is fastened.

In accordance with the example embodiment, since the probe card and the test box reproduce a circuit configuration on which a semiconductor device separated from a substrate is to be mounted, it is possible to inspect electric characteristics of the semiconductor device formed on the substrate in the same state as the state where the semiconductor device is actually mounted on these corresponding circuit configurations, prior to separating the semiconductor device from the substrate. As a result, an error that might not be detected until the semiconductor device is actually mounted on the circuit configurations can be detected at an earlier timing without separating the semiconductor device from the substrate. Thus, man-hour or materials may not be unnecessarily consumed, so that highly efficient inspection of electric characteristics of the semiconductor device can be implemented.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

FIG. 3A is a plane view, FIG. 3B is a side view, and FIG. 3C is a front view; FIG. 4A shows an internal structure in accordance with the example embodiment, FIG. 4B shows an internal structure in accordance with a first modification example of the example embodiment, and FIG. 4c shows an internal structure in accordance with a second modification example of the example embodiment.

DETAILED DESCRIPTION

Figure 1:
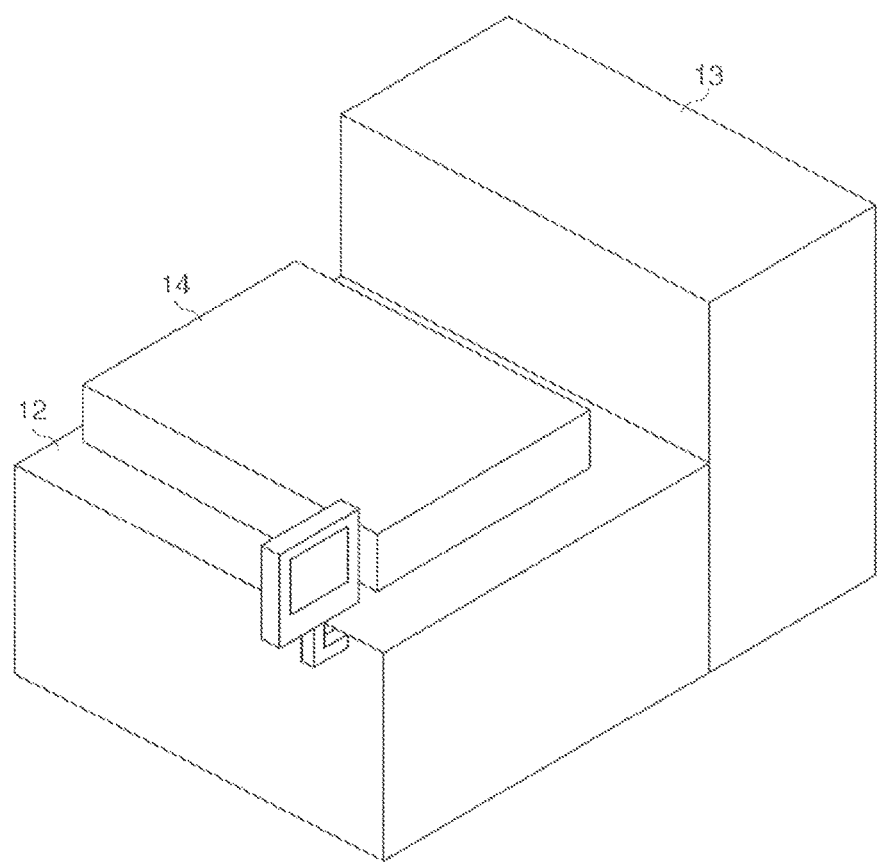
FIG. 1 is a perspective view schematically depicting a configuration of a prober as a substrate inspection apparatus in accordance with an example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example embodiment. Still, the example embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Figure 2:
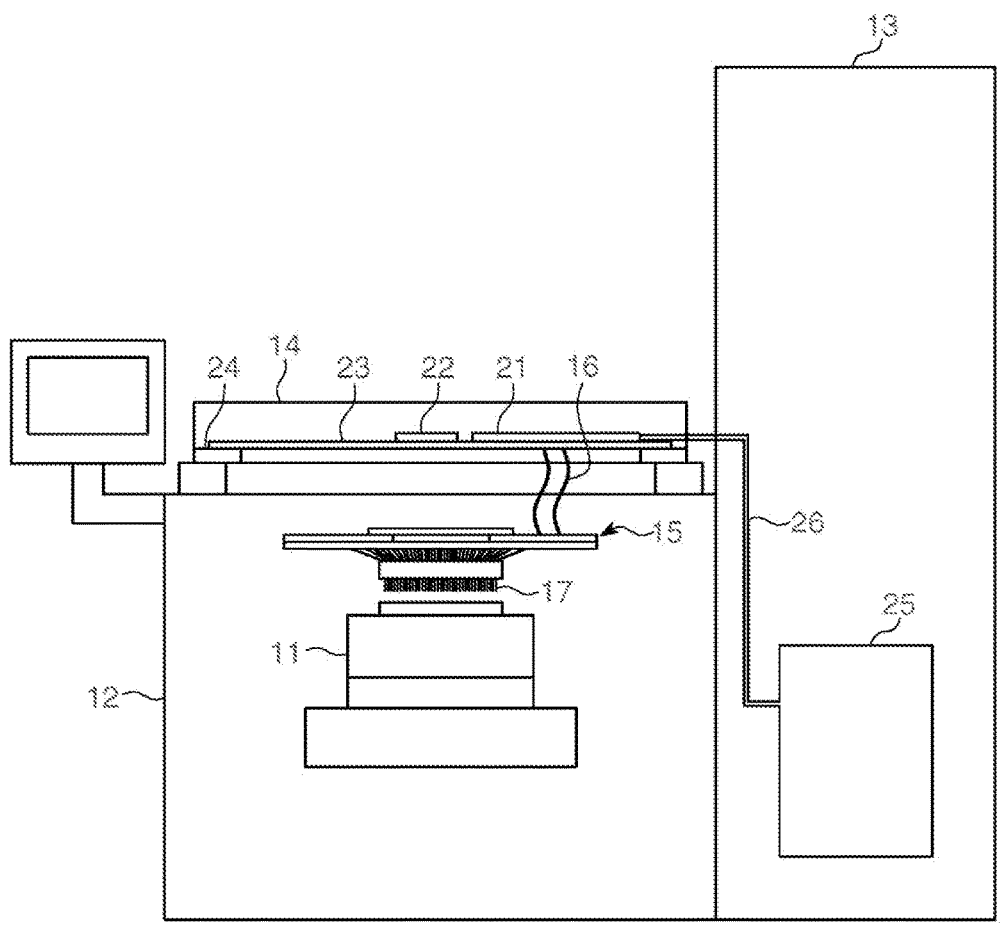
FIG. 2 is a front view schematically depicting a configuration of the prober as the substrate inspection apparatus in accordance with the example embodiment.

FIG. 1 is a perspective view schematically depicting a configuration of a prober as a substrate inspection apparatus in accordance with an example embodiment, and FIG. 2 is a front view of the prober. In FIG. 2, components embedded in a main body 12, a loader 13 and a test box 14 to be described later are indicated by dashed lines.

Referring to FIG. 1 and FIG. 2, a prober 10 includes a main body 12 accommodating therein a stage 11 configured to hold a wafer W thereon; a loader 13 provided adjacent to the main body 12; and a test box 14 provided to cover the main body 12. This prober 10 is configured to inspect electric characteristics of a semiconductor device which is an inspection target object formed on the wafer W.

The main body 12 is of a housing shape having hollow inside. A probe card 15, in addition to the stage 11, is also provided inside the main body 12 to face the stage 11. The probe card 15 is configured to face the wafer W. A multiple number of probe needles 17, which correspond to electrode pads or solder bumps of the semiconductor device of the wafer W, are provided on a bottom surface of the probe card 15 facing the wafer W.

The wafer W is supported on the stage 11 such that a relative position thereof with respect to the stage 11 is not deviated, and the stage 11 is configured to be moved in a horizontal direction and in a vertical direction. The stage 11 adjusts the relative positions between the probe card 15 and the wafer W, and brings the electrode pads or the like of the semiconductor device into contact with the corresponding probe needles 17.

The test box 14 is of a rectangular shape, and is electrically connected to the probe card 15 via a flexible wiring 16 when covering the main body 12.

The loader 13 takes out a wafer W having a semiconductor device formed thereon from a FOUP (not illustrated) serving as a transfer container accommodating therein the wafer W. Then, the loader 13 mounts the wafer W on the stage 11 within the main body 12. Further, upon the completion of inspection of electric characteristics of the semiconductor device, the loader 13 unloads the inspected wafer W from the stage 11 and loads the inspected wafer W back into the FOUP.

Figure 3A:
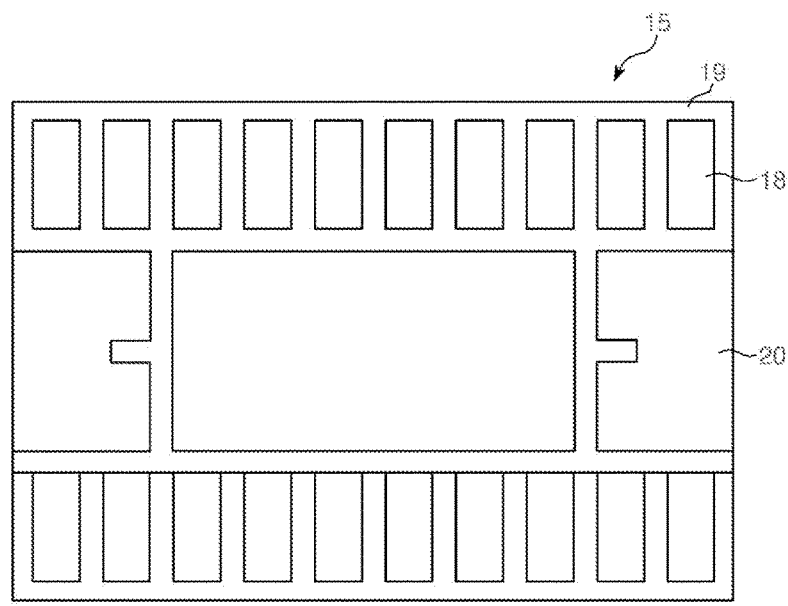
FIG. 3A to FIG. 3C schematically illustrate a configuration of a probe card of FIG. 1 and FIG. 2.
Figure 3B:
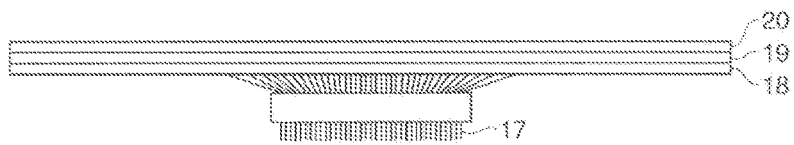
Figure 3C:
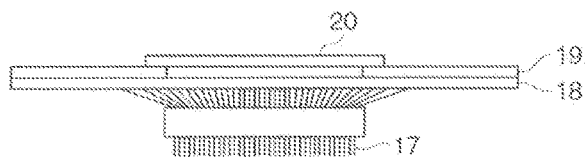

FIG. 3A to FIG. 3C are diagrams schematically illustrating a configuration of the probe card of FIG. 1 and FIG. 2. FIG. 3A is a plane view; FIG. 3B, a side view; and FIG. 3C, a front view.

In FIG. 3A to FIG. 3C, the probe card 15 has a load board 18 including a card-side inspection circuit (not illustrated); a stiffener 19, which is a frame having a hash sign (#) shape, configured to suppress bending of the load board 18; a beam 20 which reinforces the stiffener 19; and the multiple number of probe needles 17 provided on a bottom surface of the load board 18.

Each of the probe needles 17 is connected to the card-side inspection circuit. Further, each of the probe needles 17 transfers an electric signal from the corresponding one of the electric pads or the solder bumps of the semiconductor device to the card-side inspection circuit. The card-side inspection circuit is configured to reproduce a circuit configuration of, e.g., the function extension card, on which the semiconductor device is to be mounted after separated from the wafer W. In the present example embodiment, the semiconductor device is a main processing unit (MPU), and the card-side inspection circuit reproduces the circuit configuration of the extension card. Here, however, it should be noted that the semiconductor device is not limited to the MPU, and the circuit configuration to be reproduced by the card-side inspection circuit is also not limited to the circuit configuration of the extension card.

Referring back to FIG. 1 and FIG. 2, the test box 14 has a board 23 including a box-side inspection circuit 21 and a hard disk 22 composed of a solid state drive (SSD) or the like; and a frame 24 configured to support the board 23.

The wiring 16 is configured to transfer an electric signal from the card-side inspection circuit of the probe card 15 to the box-side inspection circuit 21. The box-side inspection circuit 21 includes an inspection control unit and a storage unit (both of which are not illustrated), and is configured to reproduce a part of a circuit configuration to which the function extension card is connected, e.g., a part of a circuit configuration of a mother board. In the prober 10, by replacing the box-side inspection circuit 21 of the test box 14, a part of multiple types of circuit configurations on which the semiconductor device is to be mounted is reproduced. In addition, the circuit configuration to be reproduced by the box-side inspection circuit 21 is not limited to the circuit configuration of the mother board.

The loader 13 incorporates therein a base unit 25 including a power supply, a controller and a simple measurement module. The base unit 25 is connected to the box-side inspection circuit 21 by the wiring 26, and the power supply of the base unit 25 is configured to supply a power to the box-side inspection circuit 21 and to the card-side inspection circuit via the box-side inspection circuit 21. The controller is configured to instruct the box-side inspection circuit 21 to start inspection of the electric characteristics of the semiconductor device.

As described above, in the prober 10, a part of the multiple types of circuit configurations, e.g., a part of circuit configurations of the mother board is reproduced by replacing the box-side inspection circuit 21. Here, the base unit 25 reproduces a common part between the various types of circuit configurations on which the semiconductor device is to be mounted. That is, the box-side inspection circuit 21 and the base unit 25 reproduce the circuit configuration as a whole in cooperation.

In the prober 10, when performing the inspection of the electrical characteristics of the semiconductor device, the inspection control unit of the box-side inspection circuit 21, for example, is configured to transmit data to be processed by the semiconductor device as the MPU and, then, determine, based on an electrical signal from the card-side inspection circuit, whether the transmitted data is properly processed by the semiconductor device.

Further, among the card-side inspection circuit, the box-side inspection circuit and the base unit 25 in the prober 10, the card-side inspection circuit corresponding to the function extension card on which the semiconductor device is to be mounted is most closely located to the semiconductor device, physically. With this configuration, when inspecting the electrical characteristics of the semiconductor device, influence from a wiring length between the semiconductor device and the inspection circuit, e.g., influence by the change of wiring capacitance, may be minimized. Thus, it is possible to perform the inspection in a wiring environment very similar to a wiring environment within a computer which is an apparatus incorporating therein a circuit configuration on which the semiconductor device is actually mounted.

Figure 4A:
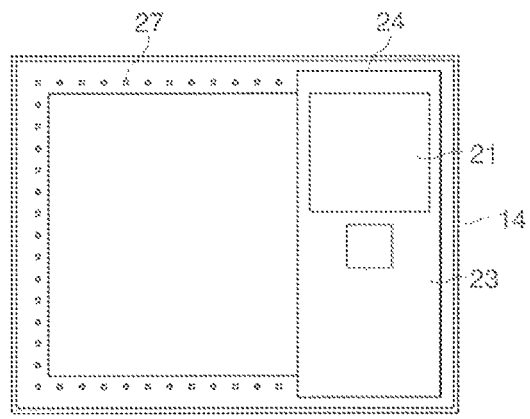
FIG. 4A to FIG. 4C are plane views schematically illustrating an internal structure of a test box of FIG. 1 and FIG. 2.
Figure 4B:
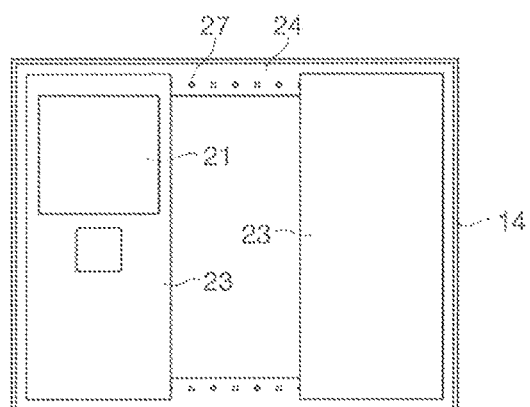
Figure 4C:
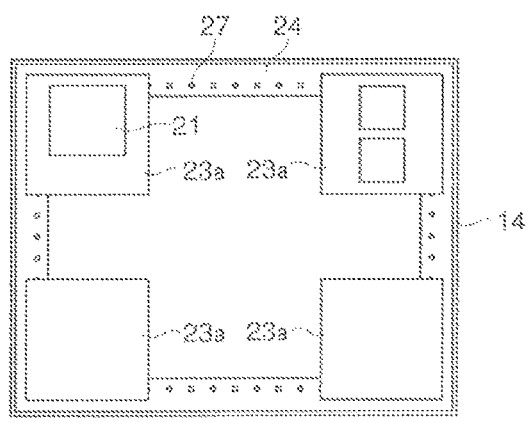

FIG. 4A to FIG. 4C are plane view schematically illustrating an internal configuration of the test box shown in FIG. 1 and FIG. 2. FIG. 4A depicts an internal configuration in accordance with the example embodiment, FIG. 4B depicts an internal configuration in accordance with a first modification example of the example embodiment, and FIG. 4C depicts an internal configuration of a second modification example of the example embodiment.

As depicted in FIG. 4A to FIG. 4C, in the test box 14, the frame 24 is protruded inward from an inner surface of a sidewall of the test box 14 along the entire periphery thereof. Further, the frame 24 includes a multiplicity of installation holes 27. By fastening the board 23 to the frame 24 by screwing bolts (not shown) into certain installation holes 27, the board 23 can be located at a desired position. The number of boards 23 fastened to the test box 14 may be varied (FIG. 4B). Besides, different shapes of boards 23a may be used (FIG. 4C). In the prober 10, since the box-side inspection circuit 21 is mounted on the board 23, the box-side inspection circuit 21 of the test box 14 can be replaced by replacing the board 23.

In the prober 10 of the present example embodiment, the card-side inspection circuit of the probe card 15 reproduces a circuit configuration on which the semiconductor device is to be mounted after separated from the wafer W, e.g., the circuit configuration of the function extension card, whereas the box-side inspection circuit 21 of the test box 14 reproduces a circuit configuration on which the semiconductor device is to be mounted, e.g., a part of the circuit configuration of the mother board. Accordingly, it is possible to inspect electric characteristics of the semiconductor device in the same state as the state where the semiconductor device is actually mounted on these corresponding circuit configurations, prior to separating the semiconductor device from the wafer W. As a result, an error that might not be detected until the semiconductor device is actually mounted in a computer can be detected at an earlier timing without separating the semiconductor device from the wafer W. Thus, man-hour or materials may not be unnecessarily consumed, so that highly efficient inspection of electric characteristics of the semiconductor device can be implemented.

Further, in the above-described prober 10, the circuit configurations on which the semiconductor device is to be mounted are reproduced by the test box 14 and the probe card 15. Thus, by changing the combination of the test box 14 and the probe card 15 through replacing the test box 14 (specifically, the board 23 on which the box-side inspection circuit 21 is mounted) or the probe card 15, it is possible to alter the circuit configurations on which the semiconductor device is to be mounted. Thus, it may be possible to easily perform inspection of electrical characteristics of the semiconductor device in multiple types of circuit configurations.

In addition, in the prober 10, the loader 13 has the base unit 25 that reproduces the common part between the various circuit configurations on which the semiconductor device is to be mounted. Thus, a part of the circuit configurations on which the semiconductor device is to be mounted and which are reproduced in the test box 14 can be simplified, so that unit cost of the box-side inspection circuit 21 incorporated in the test box 14 can be reduced.

Further, in the above-described prober 10, the probe card 15 and the test box 14 are electrically connected via the flexible wiring 16. Thus, even when a connection position of the wiring, e.g., a position of a terminal is changed as a result of a change in the circuit configuration of the probe card 15 or the test box 14, it is possible to easily re-connect the probe card 15 and the test box 14 electrically by the flexible wiring 16.

Further, in the above-described prober 10, the test box 14 includes the frame 24 to which various types of boards 23 can be fastened. Accordingly, by replacing the boards 23 fastened to the frame 24, it is possible to easily install various box-side inspection circuits 21 in the test box 14.

Moreover, in the above-described prober 10, the card-side inspection circuit of the probe card 15, the box-side inspection circuit 21 of the test box 14 and the base unit 25 of the loader 13 configured to reproduce the circuit configurations on which the semiconductor device is mounted are arranged in a separated manner. Accordingly, these component parts can be efficiently arranged with improved degree of freedom. Thus, it is not required to increase a footprint of the prober 10 in which the card-side inspection circuit, the box-side inspection circuit 21 and the base unit 25 are arranged, as compared to that of a conventional prober. Further, in the conventional prober, a test head provided on a main body incorporates therein all kinds of measurement circuits. In the prober 10 of the present example embodiment, however, since the test box 14 only incorporates the box-side inspection circuit 21 therein, the size of the test box 14 can be greatly reduced, as compared to the size of the conventional test head. Accordingly, a device necessary for mounting the test box 14 on the main body 12 can be simplified or even omitted, so that the configuration of the prober 10 can be simplified.

Although the present disclosure has been described with respect to the example embodiment, the example embodiment is not limiting, and the present disclosure is not limited thereto.

By way of example, in the above-described prober 10, the test box 14 and the probe card 15 cooperate to reproduce the circuit configurations on which the semiconductor device is to be mounted. However, it may be possible to adopt a configuration in which only the test box 14 reproduces a circuit configuration on which the semiconductor device is mounted. In such a case, since the probe card 15 may only function to deliver an inspection signal, the configuration of the probe card 15 may be simplified.

Further, in the above-described example embodiment, the box-side inspection circuit 21 reproduces the circuit configuration of the mother board, whereas the card-side inspection circuit reproduces the circuit configuration of the function extension card. However, the circuit configuration reproduced by the box-side inspection circuit 21 may not be limited to the circuit configuration of the mother board, and, likewise, the circuit configuration reproduced by the card-side inspection circuit may not also be limited to the circuit configuration of the function extension card. That is, the circuit configuration reproduced by the card-side inspection circuit or the box-shaped inspection circuit 21 may be any of various types of circuit configurations on which the semiconductor device is to be mounted. Further, the semiconductor device may not also be particularly limited. By way of non-limiting example, in case that the card-side inspection circuit reproduces the circuit configuration of the extension card, the semiconductor device may be a MPU (Main Processing Unit). Meanwhile, in case that the box-side inspection circuit 21 reproduces the circuit configuration of the mother board, the semiconductor device may be an APU (Accelerated Processing Unit) or a GPU (Graphics Processing Unit). Further, in case that the circuit configuration reproduced by the card-side inspection circuit or the box-side inspection circuit 21 is a circuit configuration of a television, the semiconductor device may be an RF tuner.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:

1. An inspection apparatus for inspecting a semiconductor device formed on a substrate, comprising:
   a probe card comprising a card-side inspection circuit and a plurality of probes to be brought into contact with electrodes of the semiconductor device;
   a test box electrically connected to the probe card, the test box comprising a box-side inspection circuit; and
   a loader configured to load the substrate,
   wherein the card-side inspection circuit has a circuit configuration of a function extension card to which the semiconductor device is to be mounted after being separated from the substrate,
   wherein the box-side inspection circuit has a circuit configuration of a motherboard to which the function extension card is connected,
   wherein the probe card is located closer to the semiconductor device than the test box,
   wherein the loader includes a basic unit which includes at least one of a power supply, a controller and a measurement module, said basic unit forming a common part between various circuit configurations on which the semiconductor device is to be mounted,
   wherein the box-side inspection circuit and the basic unit form the circuit configurations on which the semiconductor device is to be mounted,
   wherein the power supply of the basic unit is configured to supply a power to the box-side inspection circuit and to the card-side inspection circuit via the box-side inspection circuit, and the controller of the basic unit is configured to control the box-side inspection circuit to inspect electric characteristics of the semiconductor device, and
   wherein the semiconductor device is a MPU (Main Processing Unit), an APU (Accelerated Processing Unit), a GPU (Graphics Processing unit), or a RF tuner.

2. The substrate inspection apparatus of claim 1, wherein the probe card and the test box are electrically connected to each other via a flexible wiring.

3. The substrate inspection apparatus of claim 1, wherein the test box includes a frame to which a board having the box-side inspection circuit is fastened.

* * * * *